United States Patent
Shibata

(10) Patent No.: US 6,537,858 B1
(45) Date of Patent: Mar. 25, 2003

(54) METHOD FOR MANUFACTURING SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/807,012

(22) PCT Filed: Aug. 7, 2000

(86) PCT No.: PCT/JP00/05270

§ 371 (c)(1),
(2), (4) Date: Apr. 6, 2001

(87) PCT Pub. No.: WO01/11677

PCT Pub. Date: Feb. 15, 2001

(30) Foreign Application Priority Data

Aug. 9, 1999 (JP) .............................. 11-224966

(51) Int. Cl.7 .......................... H01L 21/44; H01L 21/48; H01L 21/50
(52) U.S. Cl. ...................... 438/124; 438/106; 438/126; 438/127; 257/701; 257/730; 257/787
(58) Field of Search ................................. 438/106, 124, 438/126, 127; 257/701, 730, 787

(56) References Cited

U.S. PATENT DOCUMENTS 6,105,245 A    8/2000   Furukawa 6,194,250 B1 *  2/2001   Melton et al. ............... 438/126

FOREIGN PATENT DOCUMENTS

| JP | 2-240940 | 9/1990 |
|----|----------|--------|
| JP | 10-289923 | 10/1998 |
| JP | 11-195743 | * 7/1999 |
| JP | 2000-164611 | 6/2000 |

* cited by examiner

*Primary Examiner*—David L. Talbott
*Assistant Examiner*—David A Zarneke
(74) *Attorney, Agent, or Firm*—Rader, Fishman & Grauer PLLC

(57) ABSTRACT

A method of fabricating a semiconductor device in which an external connection surface of a lead electrically connected to a semiconductor chip is exposed in a state where it is nearly flush with a surface of a package. The method includes a resin sealing step for integrally forming a sealing portion for sealing the semiconductor chip and a protective resin layer almost covering the external connection surface using a material for the package, and a resin removing step for removing at least a part of the protective resin layer, to expose the external connection surface. The resin removing step may be a grinding step for grinding the protective resin layer.

7 Claims, 4 Drawing Sheets

METHOD FOR MANUFACTURING SEMICONDUCTOR DEVICE

TECHNICAL FIELD

The present invention relates to a method of fabricating a semiconductor device. Particularly, it relates to a method of fabricating a semiconductor device to which QFN (Quad Flat Non-Leaded Package) is applied.

BACKGROUND ART

In recent years, QFN has been proposed as a structure for miniaturizing semiconductor devices. In the semiconductor device to which the QFN is applied, a surface 101a of a lead 101 for connection to the exterior is exposed in a state where it is nearly flush with a reverse surface 102a of a package 102, as shown in FIGS. 3A and 3B. The connection to the exterior can be achieved by joining the exposed surface 101a of the lead 101 to an external electrode formed on a mounting board, for example. That is, in the QFN-type semiconductor device, the lead 101 does not project from the package 102. Consequently, the occupied area of the QFN-type semiconductor device on the mounting board and the height thereof can be made smaller, as compared with those of a typical semiconductor device having a lead pin projecting from a package.

In the QFN-type semiconductor device, a semiconductor chip 103 is mounted on an island 104 of a lead frame, as shown in FIG. 4A. The mounted semiconductor chip 103 and the lead 101 are connected to each other by a bonding wire 105. After an assembly of the semiconductor chip 103 and the lead frame is thus formed, the assembly is set in a metal mold 106 to carry out a resin sealing step, thereby making it possible to obtain the QFN-type semiconductor device.

The metal mold 106 used for the resin sealing step comprises a lower metal mold 107 having a fitting recess 107a in which the lead 101 can be fitted formed therein and an upper metal mold 108 having a cavity 108a capable of containing the assembly formed therein. In the resin sealing step, the assembly is set in the lower metal mold 107 with the lead 101 fitted in the fitting recess 107a of the lower metal mold 107. Thereafter, the set assembly is covered with the upper metal mold 108 so as to be contained in the cavity 108a. In this state, protective resin is injected between the lower metal mold 107 and the upper metal mold 108. After the injected protective resin is hardened to form the package 102, the assembly sealed into the package 102 is taken out of the metal mold 106. Consequently, the QFN-type semiconductor device as shown in FIG. 4B is completed.

In the QFN-type semiconductor device fabricated in the above-mentioned manner, so-called resin burrs may occur. That is, in the resin sealing step, the protective resin injected between the lower metal mold 107 and the upper metal mold 108 enters a portion between the fitting recess 107a of the lower metal mold 107 and the lead 101 fitted in the fitting recess 107a. Consequently, the protective resin 109 adheres to the surface 101a, exposed to a reverse surface of the package 102, of the lead 101, as shown in FIG. 4B.

The exposed surface 101a of the lead 101 is an external joint surface which is joined to the external electrode formed on the mounting board, for example. If the protective film 109 adheres to the exposed surface 101a, therefore, the electrical connection between the semiconductor device (the semiconductor chip 103) and the exterior may not be achieved.

DISCLOSURE OF INVENTION

An object of the present invention is to provide a method of fabricating a semiconductor device capable of preventing protective resin from adhering to an external joint surface of a lead.

Another object of the present invention is to provide a method of fabricating a semiconductor device having no protective resin adhering to an external joint surface of a lead, being thin, and having good heat dissipation properties.

Still another object of the present invention is to provide a semiconductor device being thin and having good heat dissipation properties.

The present invention relates to a method of fabricating a semiconductor device in which an external connection surface of a lead electrically connected to a semiconductor chip is exposed in a state where it is nearly flush with a surface of a package. The method according to the present invention comprises a resin sealing step for integrally forming a sealing portion for sealing the semiconductor chip and a protective resin layer almost covering the external connection surface using a material for the package, and a resin removing step for removing at least a part of the protective resin layer, to expose the external connection surface. The resin removing step may be a grinding step for grinding the protective resin layer. Further, the resin removing step may be the step of removing at least a part of the protective resin layer by etching.

More specifically, the present invention relates to a method of fabricating a semiconductor device in which a semiconductor chip is electrically connected to one surface of a lead, and the other surface of the lead is exposed in a state where it is nearly flush with a surface of a package for electrical connection to the exterior. The method comprises a resin sealing step for forming an integral protective resin layer for almost covering the one surface and the other surface of the lead and sealing the semiconductor chip using the material for the package, and a resin removing step for removing at least a part of the protective resin layer from the other surface of the lead to expose the other surface of the lead. In this case, the other surface of the lead corresponds to the external connection surface.

It is preferable that the protective resin layer has a flat surface approximately parallel to the external connection surface and being of approximately the same size of the plane size of the semiconductor device.

It is preferable that the protective resin layer is formed so as to cover at least an inner edge of the semiconductor device on the external connection surface.

According to the present invention, it is possible to obtain a semiconductor device by integrally forming the sealing portion for sealing the semiconductor chip and the protective resin layer for almost covering the external connection surface and then, removing at least a part of the protective resin layer to expose the external connection surface. Consequently, the possibility that protective resin which is the material for the package remains adhering to the external connection surface of the lead is eliminated. Accordingly, the semiconductor device fabricated in this method can achieve good electrical connection to the exterior when the external connection surface of the lead exposed from the package is joined to an external electrode formed on a mounting board, for example.

According to this method, at least a part of the protective resin layer almost covering the external connection surface of the lead is removed, to expose the lead. Even if the removal is performed by grinding, therefore, a large force may not be exerted on the lead, and the lead may not be stripped from the package.

The electrical connection between the lead and the semiconductor chip may be achieved by carrying out, before the resin sealing step, a mounting step for mounting the semiconductor chip on an island of a lead frame; and a bonding step for bonding the semiconductor chip mounted on the island and the lead to each other.

In one embodiment of the present invention, the semiconductor chip is mounted with an inactive surface, which is opposite to an active surface having functional devices formed thereon, joined to the island. Both the active surface of the semiconductor chip and a joint surface of the island and the semiconductor chip are arranged on one side of a plane including the external connection surface.

In another embodiment of the present invention, the active surface of the semiconductor chip is arranged on one side of a plane including the external connection surface, and a joint surface of the island and the semiconductor chip is arranged on the other side of the plane including the external connection surface. In this case, in the resin removing step, the protective resin layer and the island are removed by grinding or the like. Accordingly, the inactive surface of the semiconductor chip is exposed.

According to this method, the protective resin layer and the island are removed, thereby making it possible to further thin the semiconductor device.

The semiconductor device fabricated by this method can efficiently dissipate heat from the semiconductor chip because the inactive surface of the semiconductor chip is exposed from the package.

When the active surface of the semiconductor chip is directed upward, the joint surface of the island and the semiconductor chip is positioned below the plane including the external connection surface, and the active surface of the semiconductor chip is positioned above the plane including the external connection surface.

The foregoing and other objects, features, aspects and advantages of the present invention will become more apparent from the following description of the present invention when taken in conjunction with the accompanying drawings.

BRIEF DESCRIPTION OF THE DRAWINGS

FIG. 3A illustrates the side, and FIG. 3B illustrates the reverse surface side.

MODES FOR CARRYING OUT THE INVENTION

Figure 1A:
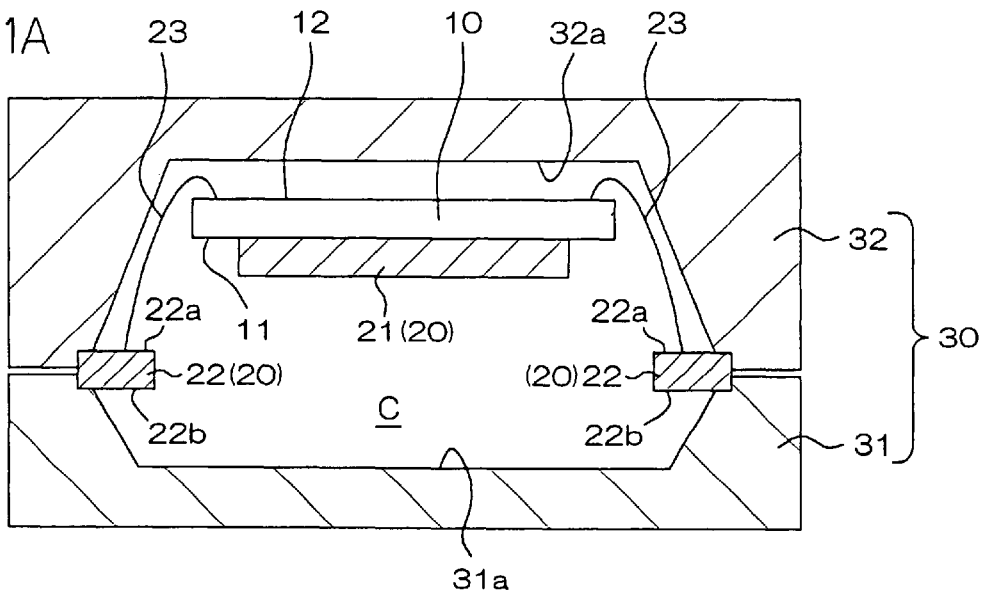
FIGS. 1A, 1B, and 1C are cross-sectional views showing the steps of a method of fabricating a semiconductor device according to a first embodiment of the present invention.
Figure 1B:
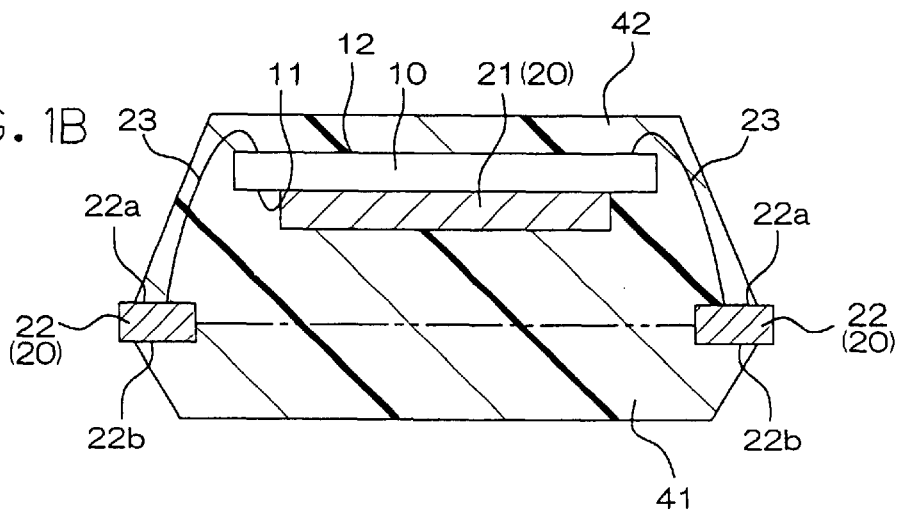
Figure 1C:
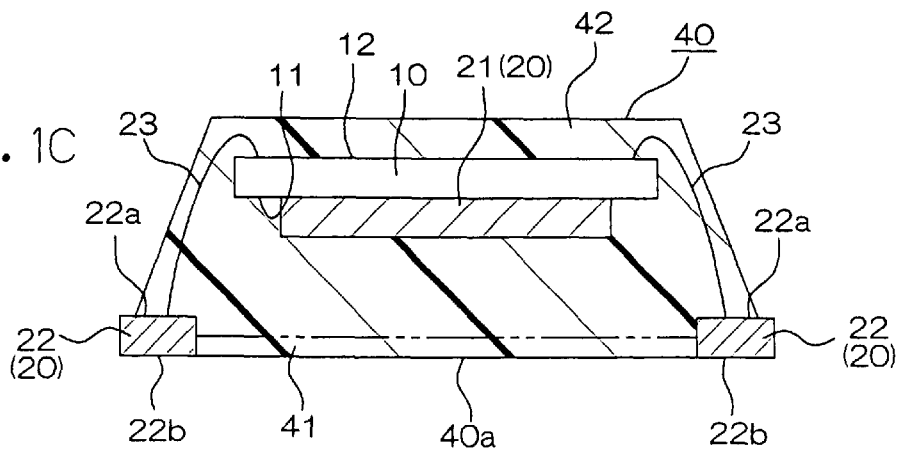

FIGS. 1A to 1C are cross-sectional views showing the steps of a method of fabricating a semiconductor device according to a first embodiment of the present invention.

FIG. 1A illustrates a resin sealing step for a semiconductor chip 10. Prior to the resin sealing step, a mounting step for mounting the semiconductor chip 10 on an island 21 of a lead frame 20 and a bonding step for bonding the semiconductor chip 10 mounted on the island 21 and a lead 22 of the lead frame 20 to each other are carried out.

In the mounting step, an inactive surface 11 of the semiconductor chip 10 is joined to a surface of the island 21 to which an adhesive such as silver paste resin is bonded, so that the semiconductor chip 10 is mounted on the island 21. The inactive surface 11 of the semiconductor chip 10 is a surface opposite to an active surface 12 which is a surface on the side of an active surface layer area having devices such as transistors and resistors formed therein.

In the bonding step, a pad (not shown) provided on the active surface 12 of the semiconductor chip 10 and one surface (an upper surface in FIG. 1) 22a of the lead 22 are connected to each other by a bonding wire 23 such as a gold thin wire. Consequently, an assembly of the semiconductor chip 10 and the lead frame 20 is obtained. A surface opposite to the one surface 22a of the lead 22 (the other surface thereof) is an external connection surface for electrical connection to the exterior. In the present embodiment, a joint surface of the semiconductor chip 10 and the island 21 is positioned above an external connection surface 22b.

The resin sealing step is carried out subsequently to the bonding step. In the resin sealing step, a metal mold 30 having a cavity C capable of containing an assembly of the semiconductor chip 10 and the lead frame 20 formed therein is used. The metal mold 30 comprises a lower metal mold 31 having a recess 31a forming the lower half of the cavity C and an upper metal mold 32 having a recess 32a forming the upper half of the cavity C.

The assembly of the semiconductor chip 10 and the lead frame 20 is contained in the cavity C in a state where an end of the lead 22 is interposed between a mouth edge of the recess 31a of the lower metal mold 31 and a mouth edge of the recess 32a of the upper metal mold 32. Thereafter, protective resin such as epoxy is injected into the cavity C. When the protective resin injected into the cavity C is hardened, a lower protective resin layer 41 (a lower part of an imaginary line shown in FIG. 1B) and an upper protective resin layer 42 (an upper part of the imaginary line shown in FIG. 1B ; a sealing portion) are integrally formed in the cavity C. The integrated lower and upper protective resin layers 41 and 42 seal the assembly of the semiconductor chip 10 and the lead frame 20. Thereafter, the assembly of the semiconductor chip 10 and the lead frame 20 which is sealed into the lower protective resin layer 41 and the upper protective resin layer 42 is taken out of the metal mold 30, as shown in FIG. 1B.

FIG. 1C illustrates a grinding step carried out subsequently to the resin sealing step. In the grinding step, a portion, positioned below the external connection surface 22b of the lead 22, of the lower protective resin layer 41 is almost uniformly ground using a grinding device such as a grinder. The grinding of the lower protective resin layer 41 is continued until the external connection surface 22b of the lead 22 is exposed. When the external connection surface 22b of the lead 22 is exposed, the grinding step is terminated. The external connection surface 22b of the lead 22 is thus exposed in a state where it is nearly flush with a reverse surface of a package 40, thereby completing a QFN-type semiconductor device. The package 40 comprises a residual portion of the lower protective resin layer 41 and the upper protective resin layer 42.

As described in the foregoing, according to the present embodiment, the assembly of the semiconductor chip 10 and the lead frame 20 is set in the cavity C of the metal mold 50, to form the lower protective resin layer 41 and the upper protective resin layer 42. Thereafter, the portion, positioned below the external connection surface 22b of the lead 22, of the lower protective resin layer 41 is ground to expose the external connection surface 22b of the lead 22, thereby obtaining the semiconductor device. Consequently, the possibility that protective resin remains adhering to the external connection surface 22b of the lead 22 is eliminated. Accordingly, the external connection surface 22b of the lead 22 exposed from the package 40 is joined to an external electrode formed on a mounting board, for example, thereby making it possible to achieve good electrical connection between the semiconductor device and the exterior.

Figure 4A:
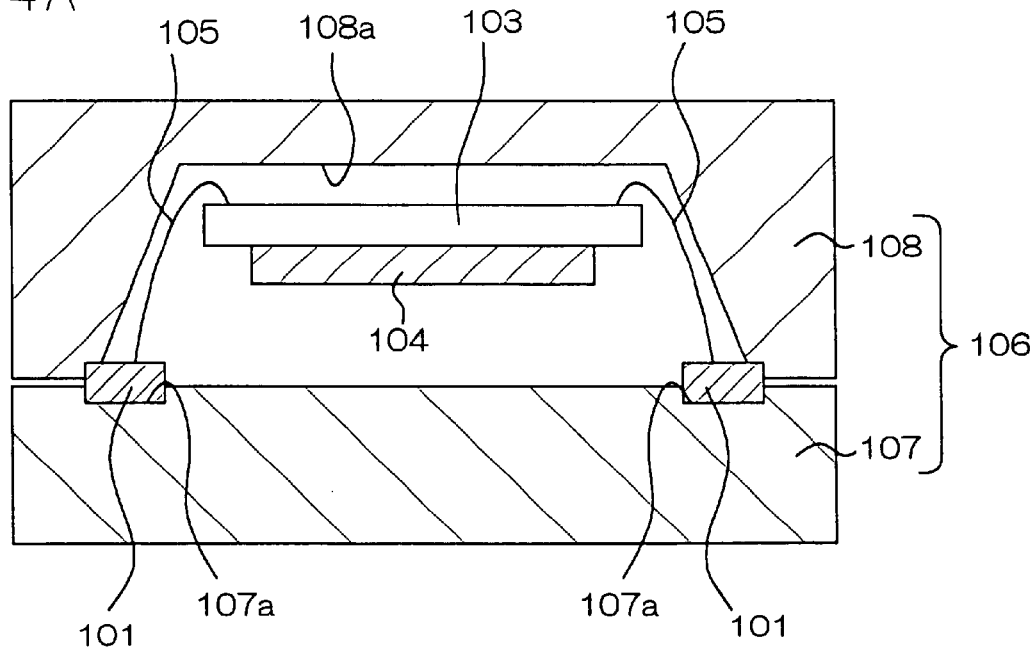
FIGS. 4A and 4B are cross-sectional views for explaining a conventional method fabricating a QFN-type semiconductor device.
Figure 4B:
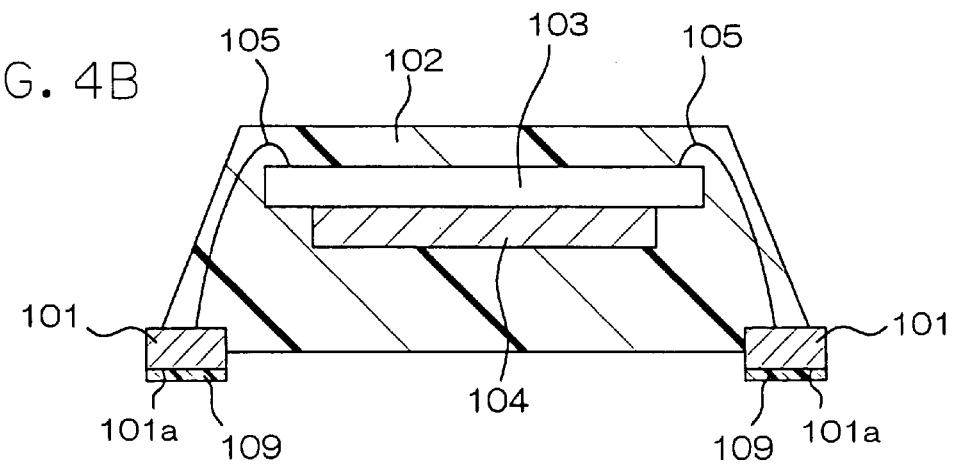

It is considered that the QFN-type semiconductor device is fabricated in the conventional method described with reference to FIGS. 4A and 4B, to grind and remove the protective resin adhering to only the exposed surface of the lead. When the protective resin adhering to only the exposed surface of the lead is ground, however, a relatively large force is exerted on the lead. Accordingly, the lead may be stripped from the package. Contrary to this, according to the method in the present embodiment, the lower protective resin layer 41 is almost uniformly ground to expose the external connection surface 22b of the lead 22. Accordingly, by the grinding, a large force may not be exerted on the lead 22, and the lead 22 may not be stripped from the package 40.

Figure 2A:
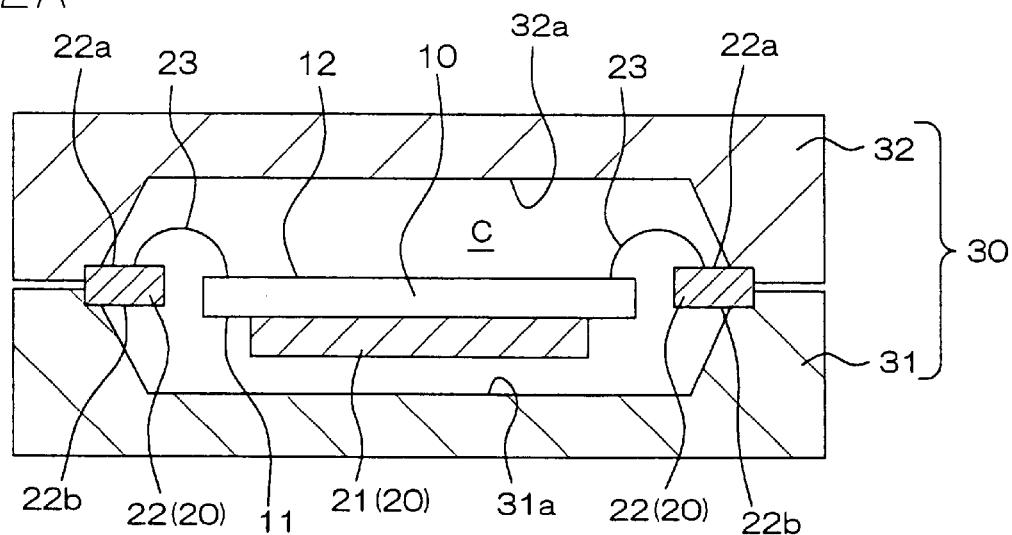
FIGS. 2A, 2B, and 2C are cross-sectional views showing the steps of a method of fabricating a semiconductor device according to a second embodiment of the present invention.
Figure 2B:
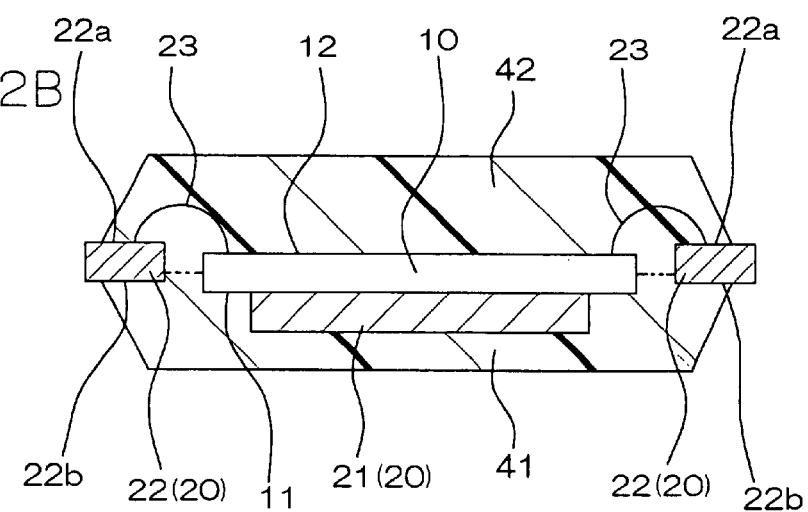
Figure 2C:
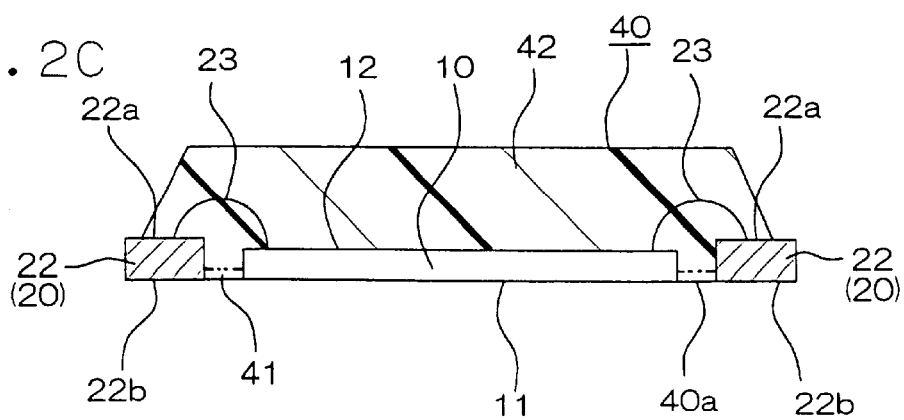
Figure 3A:
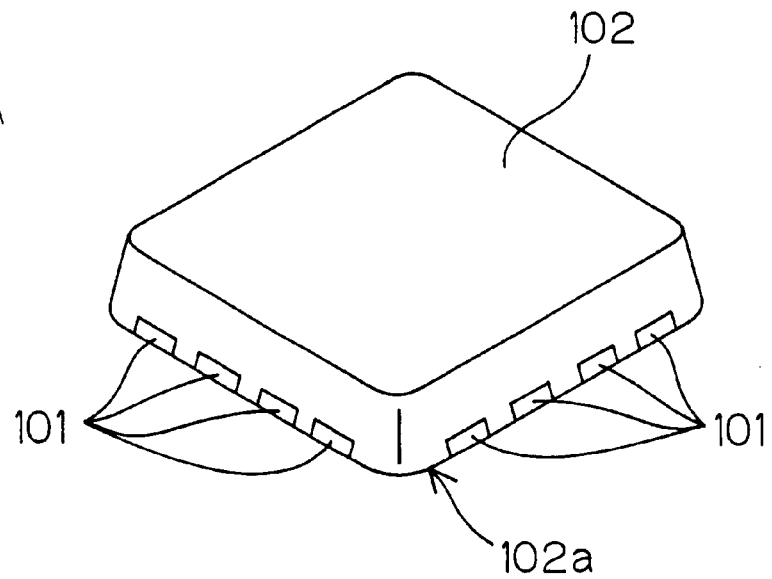
FIGS. 3A and 3B are perspective views showing the appearance of a QFN-type semiconductor device, where
Figure 3B:
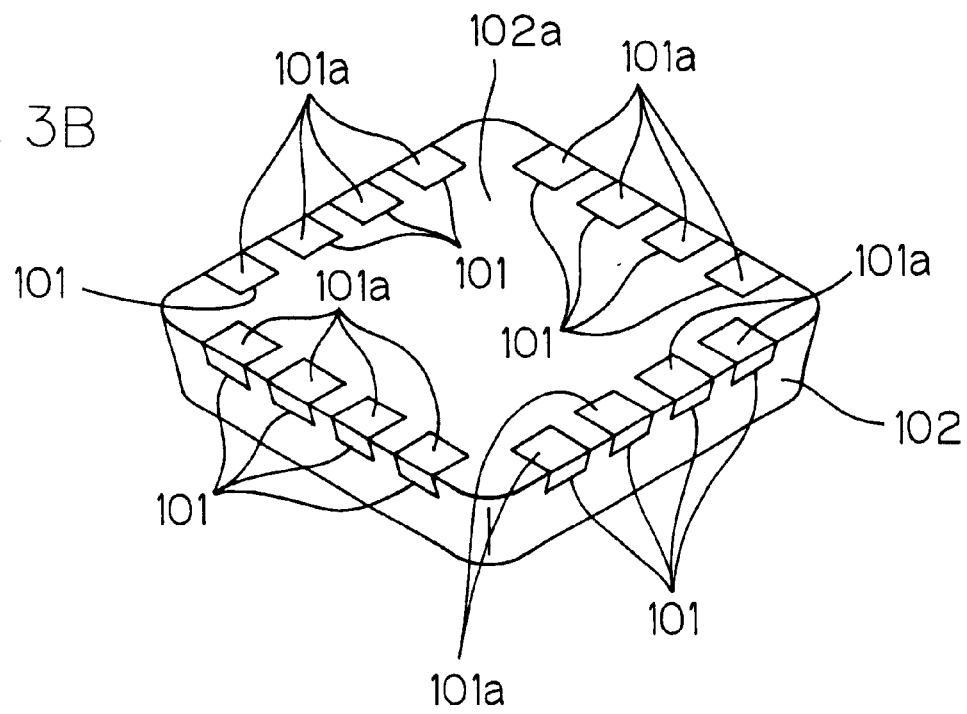

FIGS. 2A to 2C are cross-sectional views showing the steps of a method of fabricating a semiconductor device according to a second embodiment of the present invention. In FIGS. 2A to 2C, the same reference numerals as those shown in FIGS. 1A to 1C are assigned to portions corresponding to the portions shown in FIGS. 1A to 1C.

In the above-mentioned first embodiment, a positional relationship between the island 21 and the lead 22 is set such that the joint surface of the semiconductor chip 10 and the island 21 is positioned above the external connection surface 22b of the lead 22 (see FIG. 1A). Contrary to this, in the second embodiment, a positional relationship between an island 21 and a lead 22 is set such that a joint surface of a semiconductor chip 10 and the island 21 is positioned below an external connection surface 22b of the lead 22, and an active surface 12 of the semiconductor chip 10 is positioned above the external connection surface 22b of the lead 22 (see FIG. 2A). In this case, the island 21 is positioned inside a lower protective resin layer 41 below the external connection surface 22b of the lead 22 (see FIG. 2B).

After a resin sealing step, a grinding step using a grinding device such as a grinder is carried out. In the grinding step, a portion, below the external connection surface 22b of the lead 22, of a lower protective resin layer 41 is almost uniformly ground until the external connection surface 22b of the lead 22 is exposed. In the step of grinding the lower protective resin layer 41, the island 21 is ground and removed, and an inactive surface 11 of the semiconductor chip 10 is further ground. The external connection surface 22b of the lead 22 is thus exposed in a state where it is nearly flush with a reverse surface 40a of a package 40, as shown in FIG. 2C, thereby completing a QFN-type semiconductor device.

Thus in the present embodiment, the joint surface of the semiconductor chip 10 and the island 21 is positioned below the external connection surface 22b of the lead 22, and the active surface 12 of the semiconductor chip 10 is positioned above the external connection surface 22b of the lead 22. In the grinding step, the lower protective resin layer 41 as well as the island 21 and the inactive surface 11 of the semiconductor chip 10 are ground. Consequently, the semiconductor device can be made thinner, as compared with the semiconductor device fabricated in the method according to the first embodiment.

Since the inactive surface 11 of the semiconductor chip 10 is exposed from the package 40, heat from the semiconductor chip 10 can be efficiently dissipated. No devices such as transistors are formed on the inactive surface 11, exposed from the package 40, of the semiconductor chip 10, thereby eliminating the possibility that the performance of the semiconductor chip 10 is degraded due to the exposure from the package 40.

Although in the present embodiment, the positional relationship between the island 21 and the lead 22 is set such that the joint surface of the semiconductor chip 10 and the island 21 is positioned below the external connection surface 22b of the lead 22, the joint surface of the semiconductor chip 10 and the island 21 may be set in a state where it is nearly flush with the external connection surface 22b of the lead 22.

Although description has been made of the two embodiments of the present invention, the present invention can be embodied in other embodiments. Although the package is ground using a grinding device such as a grinder, for example, such mechanical grinding may be replaced with chemical mechanical polishing (CMP). In addition to the grinding, other methods such as etching may be applied in order to remove the protective resin layer 41.

Although the present invention has been described and illustrated in detail, it is clearly understood that the same is by way of illustration and example only and is not to be taken by way of limitation, the spirit and scope of the present invention being limited only by the terms of the appended claims.

The application corresponds to Japanese Patent Application Serial No. 11-224966 filed with the Japanese Patent Office on Aug. 9, 1999, the disclosure of which is incorporated herein by reference.

What is claimed is:

1. A method of fabricating a semiconductor device in which an external connection surface of a lead electrically connected to a semiconductor chip is exposed in a state where the external connection surface is nearly flush with a surface of a package, the method comprising:

a mounting step for mounting the semiconductor chip on an island of a lead frame;

a bonding step for bonding the semiconductor chip mounted on the island and the lead to each other;

a resin sealing step for integrally forming, using a material for the package, a sealing portion for sealing the semiconductor chip and a protective resin layer substantially covering the external connection surface; and a resin removing step for removing at least a part of the protective resin layer, to expose the external connection surface, wherein the semiconductor chip is mounted with an inactive surface, which is opposite to an active surface having functional devices formed thereon, joined to the island, the active surface of the semiconductor chip is arranged on the other side of a plane including the external connection surface, and a joint surface between the island and the semiconductor chip is arranged in the plane including the external connection surface or the other side of the plane, and at least a part of the protective resin layer as well as the island are removed in the resin removal, to expose the inactive surface of the semiconductor chip.

2. The method according to claim 1, wherein in the resin sealing step, the protective resin layer is formed so as to cover at least an inner edge, with respect to the semiconductor device, of the external connection surface of the lead.

3. The method according to claim 1, wherein in the resin removing step, at least a part of the protective resin layer is removed such that a surface of the protective resin layer and the external connection surface of the lead are flush with each other.

4. The method according to claim 1, wherein the resin removing step is a grinding step for grinding the protective resin layer.

5. A semiconductor device comprising:
   a semiconductor chip having an active surface and an inactive surface;
   a lead electrically connected to the semiconductor chip and having an external connection surface for external connection, and
   a package composed of a protective resin layer for sealing the semiconductor chip and the lead in a state where the inactive surface of the semiconductor chip and the external connection surface of the lead are exposed.

6. The semiconductor device according to claim 5, wherein the inactive surface of the semiconductor chip and the external connection surface of the lead are exposed from the package in a state where they are flush with each other.

7. The semiconductor device according to claim 6, wherein
   the package has a bottom surface which is flush with the inactive surface of the semiconductor chip and the external connection surface of the lead.

* * * * *